(12) United States Patent
Osada et al.

(10) Patent No.: US 7,291,873 B2
(45) Date of Patent: Nov. 6, 2007

(54) HIGH ELECTRON MOBILITY EPITAXIAL SUBSTRATE

(75) Inventors: Takenori Osada, Ichihara (JP); Takayuki Inoue, Sodegaura (JP); Noboru Fukuhara, Tsukuba (JP)

(73) Assignees: Sumitomo Chemical Company, Limited, Tokyo (JP); Sumika Epi Solution Company, Ltd., Tokyo (JP)

( * ) Notice: Subject to any disclaimer, the term of this patent is extended or adjusted under 35 U.S.C. 154(b) by 0 days.

(21) Appl. No.: 10/540,514

(22) PCT Filed: Dec. 19, 2003

(86) PCT No.: PCT/JP03/16393

§ 371 (c)(1),
(2), (4) Date: Jun. 23, 2005

(87) PCT Pub. No.: WO2004/059742

PCT Pub. Date: Jul. 15, 2004

(65) Prior Publication Data

US 2006/0076576 A1 Apr. 13, 2006

(30) Foreign Application Priority Data

Dec. 25, 2002 (JP) ............................. 2002-374549

(51) Int. Cl.
*H01L 31/00* (2006.01)
(52) U.S. Cl. ............... 257/194; 257/192; 257/E31.053; 257/E33.027; 257/E21.403; 257/E21.407; 438/172

(58) Field of Classification Search ............... 257/192, 257/194, 195, 190, 20, 187, E31.053, E33.027, 257/E33.032, E33.053, E21.403, E21.407; 438/172
See application file for complete search history.

(56) References Cited

U.S. PATENT DOCUMENTS 5,449,928 A * 9/1995 Matsugatani et al. ....... 257/194

(Continued)

FOREIGN PATENT DOCUMENTS

JP 06-21106 A 1/1994

(Continued)

OTHER PUBLICATIONS

Feng Zhao et al., "Hall and photoluminescence studies of effects of the thickness of an additional $In_{0.3}Ga_{0.85}As/Al_{0.25}Ga_{0.75}As/GaAs$ high electron mobility transistors", *Materials Science in Semiconductor Processing*, vol. 5, 2000, pp. 23-26.

(Continued)

*Primary Examiner*—Sue A. Purvis
*Assistant Examiner*—Benjamin Tzu-Hung Liu
(74) *Attorney, Agent, or Firm*—Sughrue Mion, PLLC (57) ABSTRACT

A compound semiconductor epitaxial substrate for use in a strain channel high electron mobility field effect transistor, comprising an InGaAs layer as a strain channel layer 6 and AlGaAs layers containing n-type impurities as back side and front side electron supplying layers 3 and 9, wherein an emission peak wavelength from the strain channel layer 6 at 77 K is set to 1030 nm or more by optimizing the In composition and the thickness of the strain channel layer 6.

6 Claims, 6 Drawing Sheets

U.S. PATENT DOCUMENTS 6,639,254 B2 * 10/2003 Mukai et al. ............... 257/190
2003/0006407 A1 * 1/2003 Taylor ......................... 257/12

FOREIGN PATENT DOCUMENTS

| JP | 06-84959 A | 3/1994 |
|---|---|---|
| JP | 06-163599 A | 6/1994 |
| JP | 2708863 B2 | 10/1997 |
| JP | 2001-210819 A | 8/2001 |

OTHER PUBLICATIONS

U. Strauss et al., "Carrier mobilities in graded $In_xGa_{1-x}As/Al_{0.2}Ga_{0.8}As$ quantum wells for high electron mobility transistors", *J. Appl. Phys.*, vol. 80, No. 1, Jul. 1, 1996, pp. 322-325.

J.W. Matthews et al., "Defects in Epitaxial Multilayers", *Journal of Crystal Growth*, vol. 27, 1974, pp. 118-125.

J.W. Matthews et al., "Defects in Epitaxial Multilayers", *Journal of Crystal Growth*, vol. 32, 1976, pp. 265-273.

* cited by examiner

| | |
|---|---|
| i-GaAs   20nm | 24 |
| i-$Al_{0.22}Ga_{0.78}As$   3nm | 23 |
| n-$Al_{0.24}Ga_{0.76}As$   10nm   $3E18/cm^3$ | 22 |
| i-$Al_{0.24}Ga_{0.76}As$   3nm | 21 |
| i-GaAs   6nm | 20 |
| i-$In_{0.30}Ga_{0.70}As$   7.5nm | 19 |
| i-GaAs   6nm | 18 |
| i-$Al_{0.24}Ga_{0.76}As$   3nm | 17 |
| n-$Al_{0.24}Ga_{0.76}As$   4nm   $3E18/cm^3$ | 16 |
| i-$Al_{0.25}Ga_{0.75}As$   200nm | 15 |
| i-GaAs   250nm | 14 |
| i-$Al_{0.25}Ga_{0.75}As$   250nm | 13 |
| i-GaAs   200nm | 12 |
| GaAs SUBSTRATE | 11 |

FIG. 4

| | |
|---|---|
| i- GaAs    20nm | 24 |
| i- Al$_{0.22}$Ga$_{0.78}$As    3nm | 23 |
| n- Al$_{0.24}$Ga$_{0.76}$As    10nm    3E18/cm$^3$ | 22 |
| i- Al$_{0.24}$Ga$_{0.76}$As    3nm | 21 |
| i-GaAs    6nm | 20 |
| i- In$_{0.35}$Ga$_{0.65}$As    5.5nm | 31 |
| i-GaAs    6nm | 18 |
| i- Al$_{0.24}$Ga$_{0.76}$As    3nm | 17 |
| n- Al$_{0.24}$Ga$_{0.76}$As    4nm    3E18/cm$^3$ | 16 |
| i-Al$_{0.25}$Ga$_{0.75}$As    200nm | 15 |
| i-GaAs    250nm | 14 |
| i-Al$_{0.25}$Ga$_{0.75}$As    250nm | 13 |
| i-GaAs    200nm | 12 |
| GaAs SUBSTRATE | 11 |

FIG. 5

| | |
|---|---|
| i- GaAs    20nm | 24 |
| i- Al$_{0.22}$Ga$_{0.78}$As    7nm | 23A |
| n- Al$_{0.24}$Ga$_{0.76}$As    10nm    3E18/cm$^3$ | 22 |
| i- Al$_{0.24}$Ga$_{0.76}$As    3nm | 21 |
| i-GaAs    2nm | 20A |
| i- In$_{0.20}$Ga$_{0.80}$As    13.5nm | 19A |
| i-GaAs    2nm | 18A |
| i- Al$_{0.24}$Ga$_{0.76}$As    3nm | 17 |
| n- Al$_{0.24}$Ga$_{0.76}$As    4nm    3E18/cm$^3$ | 16 |
| i-Al$_{0.25}$Ga$_{0.75}$As    200nm | 15 |
| i-GaAs    250nm | 14 |
| i-Al$_{0.25}$Ga$_{0.75}$As    250nm | 13 |
| i-GaAs    200nm | 12 |
| GaAs SUBSTRATE | 11 |

FIG. 6

| Layer | ID |
|---|---|
| i- GaAs 20nm | 24 |
| i- Al$_{0.22}$Ga$_{0.78}$As 7nm | 23A |
| n- Al$_{0.24}$Ga$_{0.76}$As 10nm 3E18/cm$^3$ | 22 |
| i- Al$_{0.24}$Ga$_{0.76}$As 3nm | 21 |
| i-GaAs 6nm | 20 |
| i- In$_{0.20}$Ga$_{0.80}$As 13.5nm | 31A |
| i-GaAs 6nm | 18 |
| i- Al$_{0.24}$Ga$_{0.76}$As 3nm | 17 |
| n- Al$_{0.24}$Ga$_{0.76}$As 4nm 3E18/cm$^3$ | 16 |
| i-Al$_{0.25}$Ga$_{0.75}$As 200nm | 15 |
| i-GaAs 250nm | 14 |
| i-Al$_{0.25}$Ga$_{0.75}$As 250nm | 13 |
| i-GaAs 200nm | 12 |
| GaAs SUBSTRATE | 11 |

HIGH ELECTRON MOBILITY EPITAXIAL SUBSTRATE

TECHNICAL FIELD

The present invention relates to a compound semiconductor epitaxial substrate used for a pseudomorphic high electron mobility transistor comprising a III-V compound semiconductor and to a method for manufacturing the same.

BACKGROUND ART

A high electron mobility field effect transistor (referred to as HEMT hereinafter) has been used as an important component of a high-frequency communication instrument. A big feature of the HEMT is to have a selectively doped hetero structure comprising an electron supplying layer (a doped layer) for supplying electrons and a channel layer through which electrons run, these layers being made of different materials. In this hetero structure, electrons supplied from n-type impurities within the electron supplying layer are pooled in a potential well formed at a channel side of a heterojunction interface due to a difference of electron affinity between materials constituting the hetero junction, and then a two-dimensional electron gas is formed. Since n-type impurities supplying electrons are present in the electron supplying layer as described above and the electrons supplied from the layer run through a high purity channel so that the ionized impurities and the electrons are spatially separated from each other, the two-dimensional electron gas within the channel is hardly scattered by the ionized impurities, and consequently a high electron mobility is realized.

Although the HEMT has usually been fabricated by using an epitaxial substrate in which thin film crystal layers respectively having predetermined electronic characteristics are laminated and grown on a GaAs single crystal substrate so as to have a predetermined structure, it has been required to precisely control the thin film crystal layer forming the HEMT structure on the order of monoatomic layer level for the purpose of imparting a high electron mobility to the channel. Therefore, a molecular beam epitaxy (referred to as a MBE method, hereinafter) or a metalorganic chemical vapor deposition (referred to as a MOCVD method, hereinafter) has conventionally been used as a method for manufacturing an epitaxial substrate having a HEMT structure.

The MOCVD method, especially among other methods as described above for growing epitaxial substrates, uses an organometallic compound or a hydride of atomic species constituting an epitaxial layer as a source material and then pyrolyzes the source material on the substrate to grow a crystal thereof, so that this method is applicable to a wide range of substances and is not only suitable for precisely controlling the crystal composition and thickness thereof but also capable of processing a large amount of substrates with favorable controllability, and consequently this method has recently been used widely and commercially.

Although materials such as GaAs and AlGaAs have widely been used as III-V compound semiconductors for these epitaxial substrates since these materials with any compositions can match the lattice constants thereof with each other and allow for producing various hetero junctions while keeping good crystallinity thereof, it is necessary to further improve the electron mobility in the channel layer in order to enhance the performance of the HEMTs. Therefore, InGaAs has recently been used as a material for the channel layer instead of using GaAs, because InGaAs has extremely excellent properties as the III-V compound semiconductor used for the hetero junction, that is, InGaAs is not only excellent in its electron transporting characteristic but also capable of significantly changing its energy gap in accordance with the In composition and further capable of effectively confining the two-dimensional electrons. In addition, AlGaAs or GaAs is known as a material to be combined with InGaAs.

However, the InGaAs cannot be lattice-matched with GaAs, so that it has conventionally been impossible to obtain an epitaxial substrate having substantial physical properties by using a InGaAs layer. However, it has subsequently been found that a reliable hetero junction can be formed without unfavorably inducing a decrease in crystallinity such as producing a dislocation even when a material with lattice misfit is used provided that the misfit is within a limit of elastic deformation, so that there has practically been used an epitaxial substrate described above.

An epitaxial growth substrate having a structure in which the above described InGaAs layer is used as a channel layer part of the conventional HEMT through which two-dimensional electrons flow has been utilized for fabricating an electronic device which has a higher mobility and is excellent in a noise characteristic compared with the conventional device. The HEMT, in which InGaAs layer is used for the channel layer through which two-dimensional electrons flow, is referred to as a pseudomorphic high electron mobility transistor (hereinafter, referred to as a pHEMT).

A limit value of a thickness of the strain crystal layer in the above described lattice misfit material are given as a function of the strain crystal layer composition, and as for an InGaAs layer with respect to a GaAs layer for example, a Matthews' theoretical equation disclosed in J. Crystal Growth, 27 (1974) p. 118 and in J. Crystal Growth, 32 (1976) p. 265, is known, and this theoretical equation has been found to be experimentally correct as a whole.

JP-A-6-21106 discloses a technique for improving an electron mobility, in which an In composition of an InGaAs strain layer used as a channel layer of a pHEMT structure and a thickness of the InGaAs layer are optimized by a certain relational expression, provided that a limit value of a thickness of the InGaAs layer given by the theoretical equation is assumed to be an upper limit of the thickness range.

Since it is effective to additionally reduce the scattering of two-dimensional electrons caused by ionized impurities in order to improve the mobility, a spacer layer which has the same material and composition as an electron supplying layer and to which any impurities are not added may be inserted between the electron supplying layer and the channel layer. For example, Japanese Patent No. 2708863 discloses a structure for improving a two-dimensional electron gas concentration and an electron mobility, in which a spacer layer consisting of an AlGaAs layer and a GaAs layer is inserted between an InGaAs strain layer used as a channel layer and an n-AlGaAs electron supplying layer of a pHEMT structure and the growth condition is optimized.

When an InGaAs strain layer is used as a channel layer of the pHEMT structure through which electrons run, it is possible to improve an electron mobility at room temperature (300 K) compared with an epitaxial substrate of the HEMT structure in which a GaAs layer is used as a channel layer. However, the mobility at room temperature (300 K) as has been reported before is 8000 $cm^2/V \cdot s$ at the maximum, and thus it has been difficult to achieve an electron mobility exceeding the above described value even in the case of a pHEMT structure epitaxial substrate in which an InGaAs strain layer is used as a channel layer.

If the structure disclosed in Japanese Patent No. 2708863 is adopted in order to increase the electron mobility in the pHEMT structure epitaxial substrate, the electron mobility is improved with increases in a thickness of the spacer layer, however, a concentration of the two-dimensional electron gas formed in the channel layer decreases because a distance between the electron supplying layer and the channel layer becomes larger, and thus leads to an undesirable outcome.

In order to improve the electron mobility and the two-dimensional electron gas concentration in the channel layer simultaneously, it is effective to increase an In composition of the channel layer and to increase the layer thickness. This is because the increase in the In composition of the channel layer leads to a decrease in an effective mass of electrons which travel through the channel layer for improving the electron mobility, and further to make a difference of conduction band energy between the electron supplying layer and the channel layer larger, and consequently the two-dimensional electron gas concentration can be increased. In addition, it can be considered that the increase in the channel layer thickness may lead to a decrease in energy at an excited level of the two-dimensional electron gas, and thus may be effective for improving the two-dimensional electron gas concentration.

However, it is difficult to increase the In composition of the InGaAs strain layer and the thickness of the InGaAs layer while keeping a favorable crystal property of the InGaAs layer, because dislocation defects may be developed due to the lattice misfit with the GaAs layer. Further, in any of the above described prior arts, values of the two-dimensional electron gas concentration and the electron mobility in the pHEMT structure epitaxial substrate are not yet satisfactory in view of possibility that the characteristics of electronic devices become more favorable with the increase in these values.

Therefore, in the pHEMT structure epitaxial substrate which uses n-AlGaAs as the electron supplying layer and an InGaAs layer as the channel layer, it has strongly been desired to realize an epitaxial substrate having a higher two-dimensional electron gas concentration and a higher electron mobility compared with the currently reported values.

It is well known that the electron mobility is an important parameter for improving various characteristics such as an on-resistance, a maximum current value, or a transconductance each of which is an important performance indicator of a field effect transistor. Further improvement of the electron mobility can achieve a reduction in the build-up resistance (on-resistance). This leads to a reduction in power consumption, so that an operating time of the battery can be prolonged. At the same time, since a calorific value can be decreased, it is possible to realize higher integration of a device, and is also possible to increase a degree of freedom of modular design by reducing a chip size. From this viewpoint, it is desired to further improve the electron mobility in the case of a pHEMT which is used for various portable instruments such as a cell phone.

DISCLOSURE OF THE INVENTION

The present inventors have devoted ourselves to solve the above described problems in the prior art and have consequently found that, in a pHEMT comprising an InGaAs strain channel layer and an AlGaAs electron supplying layer containing n-type impurities, an emission peak wavelength in the InGaAs strain channel layer has a predetermined correlation with an electron mobility thereat, and then the present inventors have now achieved the present invention. That is, a high electron mobility which has never been reported before has now realized by laminating GaAs layers so as to respectively contact with a top and a bottom surfaces of the InGaAs strain channel layer and then making the thickness thereof to a certain value or more for increasing an In composition of the channel layer, thereby obtaining an emission wavelength from the channel layer of 1030 nm or more.

According to a first aspect of the present invention, there is provided a compound semiconductor epitaxial substrate used for a strain channel high electron mobility field effect transistor, comprising an InGaAs layer as a strain channel layer and an AlGaAs layer containing n-type impurities as an electron supplying layer, the above described InGaAs having an emission peak wavelength layer at 77 K of 1030 nm or more.

According to a second aspect of the present invention, there is provided the compound semiconductor epitaxial substrate as described in the above first aspect, wherein GaAs layers are provided as spacer layers respectively in contact with a top surface and a bottom surface of the above described InGaAs layer.

According to a third aspect of the present invention, there is provided the compound semiconductor epitaxial substrate as described in the above second aspect, wherein each of the above described GaAs layers has a thickness of 4 nm or more.

According to a fourth aspect of the present invention, there is provided the compound semiconductor epitaxial substrate as described in the above first aspect, wherein the above described InGaAs layer has an electron mobility at 300 K of 8300 cm$^2$/V·s or more.

According to a fifth aspect of the present invention, there is provided a method for manufacturing the compound semiconductor epitaxial substrate as described in the above first, second, third, or fourth aspect, comprising epitaxial growth of each compound semiconductor layer by employing a metalorganic chemical vapor deposition method (a MOCVD method).

BEST MODE FOR CARRYING OUT THE INVENTION

One example of an embodiment of the present invention will now be described in detail with reference to the drawings.

Figure 1:
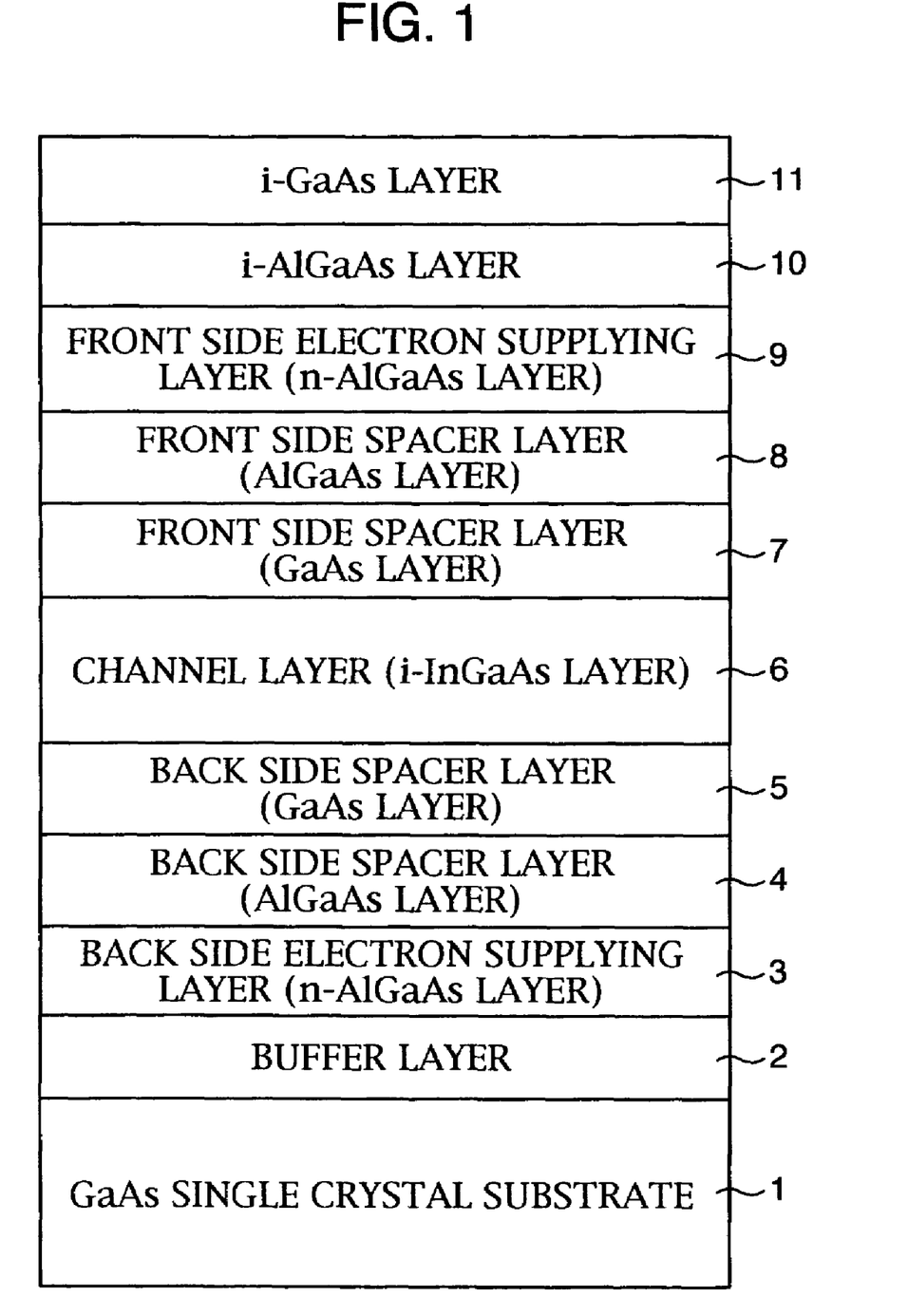
FIG. 1 is a drawing of a layer structure showing one example of an embodiment of an epitaxial substrate according to the present invention.

FIG. 1 is a drawing for describing one example of an embodiment of a pHEMT structure epitaxial substrate according to the present invention. In FIG. 1, reference numeral 1 denotes a GaAs single crystal substrate and reference numeral 2 denotes a buffer layer formed on the GaAs single crystal substrate 1. Reference numeral 3 denotes a back side electron supplying layer doped with n-type impurities formed as an n-AlGaAs layer, and a back side spacer layer (AlGaAs layer) 4 and a back side spacer layer (GaAs layer) 5 are formed on the back side electron supplying layer 3. Reference numeral 6 denotes a channel layer in which a two-dimensional electron gas is formed for flowing two-dimensional electrons, and this layer is formed as an i-InGaAs layer having a thickness from 4 nm to 13.5 nm depending on the In compositions thereof.

On the channel layer 6, a front side spacer layers 7 comprising a GaAs layer, a front side spacer layer 8 formed as an AlGaAs layer, a front side electron supplying layer 9 formed as an n-AlGaAs layer, an undoped layer (i-AlGaAs layer) 10, and another undoped layer (i-GaAs layer) 11 are formed in this order.

Since the epitaxial substrate shown in FIG. 1 is formed as described above, electrons are supplied from the back side electron supplying layer 3 to the channel layer 6 through the back side spacer layers 4 and 5, as well as supplying electrons from the front side electron supplying layer 9 to the channel layer 6 through the front side spacer layers 8 and 7. Consequently, a high concentration of a two-dimensional electron gas is formed in the channel layer 6. The concentration of the two-dimensional electron gas within the channel layer 6 is significantly influenced by the In composition of the channel layer 6 and by the thickness of the back side spacer layer 5 and the front side spacer layer 7 being respectively contact with a top and a bottom surfaces of the channel layer 6. For the purpose of dramatically improving the mobility of the two-dimensional electron gas compared with the prior art, various combinations of the In composition and the thickness of the upper and lower spacer layers were subjected to measurement for investigating a relation between an electron mobility in the channel layer 6 at room temperature and an emission peak wavelength at 77 K. The measurement results were as follows.

| In Composition of Channel Layer | Thickness of Upper and Lower Space Layer (Å) | Mobility at Room Temperature ($cm^2/V \cdot s$) | Emission Peak Wavelength (nm) |
|---|---|---|---|
| 0.20 | 20 | 7200 | 998 |
| 0.20 | 40 | 7470 | 997 |
| 0.20 | 60 | 7790 | 996 |
| 0.30 | 40 | 8420 | 1061 |
| 0.30 | 60 | 8990 | 1068 |
| 0.35 | 60 | 8950 | 1075 |
| 0.40 | 60 | 8370 | 1064 |

Figure 2:
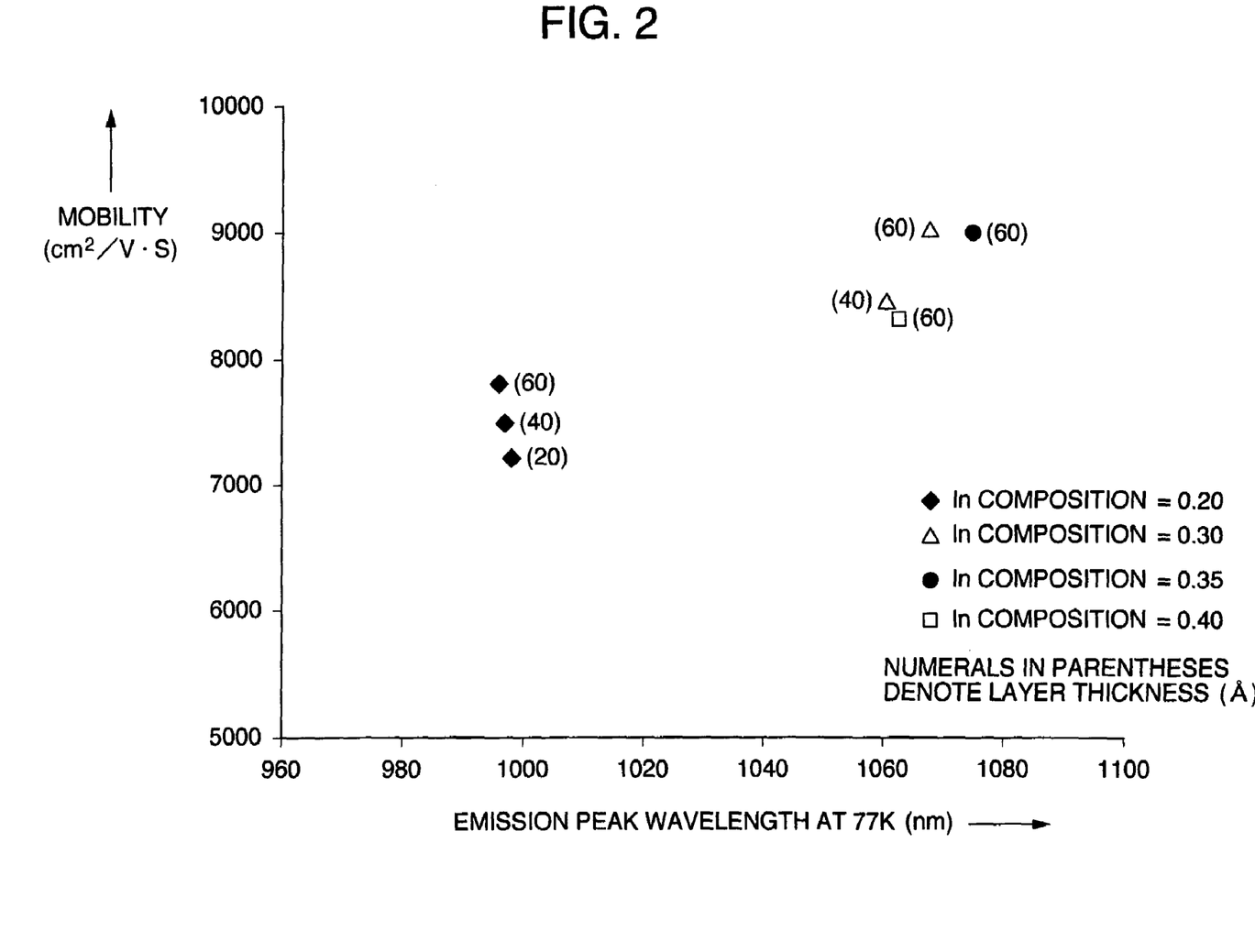
FIG. 2 is a graph showing a relation between a mobility and an emission peak wavelength in the HEMT structure illustrated in FIG. 1.

The above described measurement result is plotted as shown in FIG. 2. As can be seen from FIG. 2, when an emission peak wavelength at 77 K is 1030 nm or more, a value of an electron mobility is 8300 ($cm^2/V \cdot s$) which is so extremely high that has never been reported before. Therefore, if the emission peak wavelength from the channel layer at 77 K is 1030 nm or more in the epitaxial substrate having a pHEMT structure which uses an i-InGaAs layer as the channel layer and an AlGaAs layer containing n-type impurities as the electron supplying layer as can be seen in FIG. 1, the electron mobility can be dramatically increased.

Now there will be described a method for fabricating the epitaxial substrate which has the layer structure shown in FIG. 1. First, a GaAs single crystal substrate 1 is prepared. The GaAs single crystal substrate 1 is a high-resistive semi-insulating GaAs single crystal substrate, and it is preferable to use a GaAs substrate manufactured by a LEC (Liquid Encapsulated Czochralski) method, a VB (Vertical Bridgeman) method, a VGF (Vertical Gradient Freezing) method or the like. In any of these manufacturing methods, it should be provided a substrate having an angle of inclination from about 0.05° to 10° with respect to one crystallographic plane direction.

A surface of the GaAs single crystal substrate 1 prepared as described above is degreased and washed, etched, rinsed, and dried, and subsequently this single crystal substrate is placed on a heating table of a crystal growth reactor. An inside of the reactor is substantially substituted with high purity hydrogen before starting a heating operation. Once a moderate and stable temperature is reached within the reactor, arsenic source materials are introduced thereinto during the growth of a GaAs layer. Further, gallium source materials and aluminum source materials are introduced thereto when an AlGaAs layer is grown, in addition to introducing the arsenic source materials thereto. When an InGaAs layer is grown, gallium source materials and indium source materials are introduced thereto in addition to the introduction of arsenic source materials. The desired laminated structure is being grown by controlling a supplying amount and a supplying time of each source material. Finally, the supply of respective source materials are terminated to stop the crystal growth, and after the cooling operation, the epitaxial substrate formed by the lamination as described in FIG. 1 is removed from the reactor to complete the crystal growth. A substrate temperature at a time of growing crystals is usually from about 500° C. to 800° C.

The epitaxial substrate having the layer structure shown in FIG. 1 can be fabricated by employing a MOCVD method. The advantage of employing the MOCVD method is that the metalorganic compounds or hydrides of atomic species can be used as the source materials.

Practically, arsenic trihydride (arsine) is generally used as an arsenic source material during the epitaxial growth, however, it is also possible to use alkyl arsine which is obtained by substituting hydrogen of arsine with an alkyl group having 1 to 4 carbons. As gallium, aluminum, and indium source materials, it is generally used a trialkylate or a trihydride which is obtained by bonding an alkyl group having 1 to 3 carbons or hydrogen to each metal atom.

As an n-type dopant, it is possible to use a hydride or an alkylate having an alkyl group whose carbon number is 1 to 3 of silicon, germanium, tin, sulfur, selenium or the like.

The present invention will now be described in detail below based on the comparison of Examples with Comparative Examples, however the present invention is not limited to these examples.

EXAMPLE 1

Figure 3:
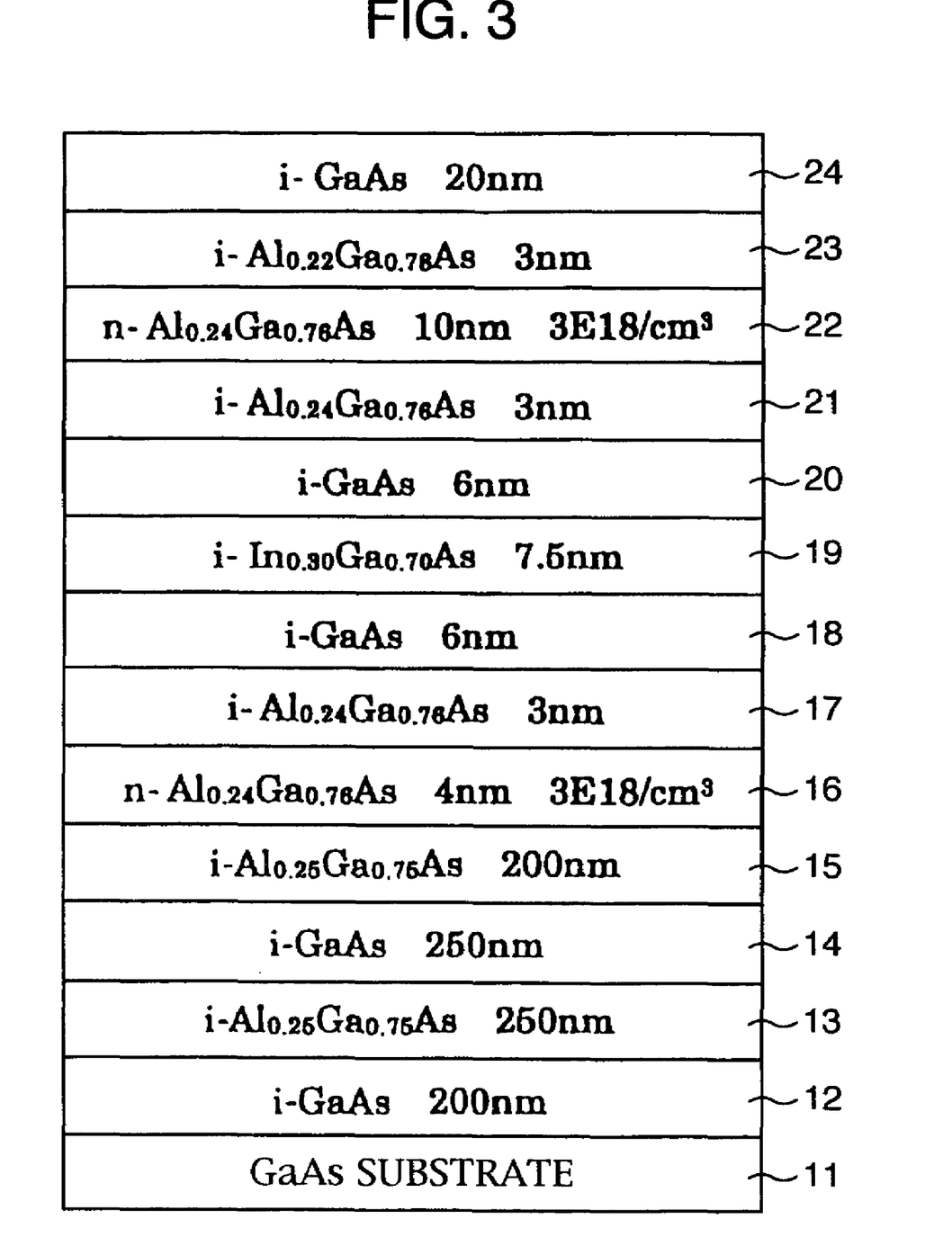
FIG. 3 is a drawing which shows a layer structure of Example 1 of an epitaxial substrate according to the present invention.

A laminated structure shown in FIG. 3 was fabricated on a semi-insulating GaAs substrate by the epitaxial growth following the VGF method by the use of a low pressure barrel-typed MOCVD reactor.

In FIG. 3, reference numeral 11 denotes a GaAs substrate as a single crystal substrate, and reference numerals 12 to 15 respectively denote buffer layers formed on the GaAs substrate 11. The buffer layers 12 to 15 herein are respectively formed as an i-GaAs layer having a thickness of 200 nm, an i-$Al_{0.25}Ga_{0.75}As$ layer having a thickness of 250 nm, an i-GaAs layer having a thickness of 250 nm, and an i-$Al_{0.25}Ga_{0.75}As$ layer having a thickness of 200 nm.

Reference numeral 16 denotes a back side electron supplying layer formed as an n-$Al_{0.24}Ga_{0.76}As$ layer having a thickness of 4 nm and doped with n-type impurities at a concentration of $3 \times 10^{18}/cm^3$, and back side spacer layers 17 and 18 are formed in this order on the back side electron supplying layer 16. In this case, the back side spacer layer 17 is an i-$Al_{0.24}Ga_{0.76}As$ layer having a thickness of 3 nm and the back side spacer layer 18 is an i-GaAs layer having a thickness of 6 nm. Reference numeral 19 denotes a channel layer in which a two-dimensional electron gas is formed, and is an i-$In_{0.30}Ga_{0.70}As$ layer having a thickness of 7.6 nm.

Each of reference numerals 20 and 21 is a front side spacer layer. In this case, the front side spacer layer 20 is an i-GaAs layer having a thickness of 6 nm and the front side spacer layer 21 is an i-$Al_{0.24}Ga_{0.76}As$ layer having a 3 nm.

Reference numeral 22 denotes a front side electron supplying layer formed as an n-$Al_{0.24}Ga_{0.76}As$ layer having a thickness of 10 nm and doped with n-type impurities at a concentration of $3 \times 10^{18}/cm^3$. Both of reference numerals 23 and 24 denote undoped layers and are respectively an i-$Al_{0.22}Ga_{0.78}As$ layer having a thickness of 3 nm and an i-GaAs layer having a thickness of 20 nm.

Trimethyl gallium (TMG) or trimethyl aluminum (TMI) was used as a source material of the third-group element, while arsine was used as a source material of the fifth-group element. Silicon was used as an n-type dopant, and the epitaxial growth was performed under the conditions that a pressure within the reactor was 0.1 atm, a growth temperature was 650° C., and a growth rate was 200 A/min to 300 A/min.

The channel layer 19 through which electrons run was epitaxially grown in order to obtain a strain InGaAs layer having an In composition of 0.30 and a thickness of 7.6 nm. Further, undoped GaAs layers as spacer layers were epitaxially grown to a thickness of 6.0 nm on a top surface and a bottom surface of the InGaAs layer used as the channel layer, respectively.

According to the laminated structure of Example 1 shown in FIG. 3 which was epitaxially grown as described above, the result of performing the hall measurement in accordance with a Van der Pauw method showed better measurement values which had never been reported before, that is, the channel layer 19 had a two-dimensional electron gas concentration of $2.28 \times 10^{12}/cm^2$ at room temperature (300 K), an electron mobility of 8990 $cm^2/V \cdot s$ at room temperature (300 K), a two-dimensional electron gas concentration of $2.59 \times 10^{12}/cm^2$ at 77 K, and an electron mobility of 35600 $cm^2/V \cdot s$ at 77 K. In addition, as a result of performing a CV measurement by using an Al schottky electrode with respect to this structure, a pinch-off voltage at a residual carrier concentration of $1 \times 10^{15}/cm^3$ was −1.93 V.

In addition, a PL spectrum at 77 K was measured with respect to the laminated structure of Example 1 as shown in FIG. 3. An emission peak wavelength from the channel layer 19 was 1068 nm.

EXAMPLE 2

Figure 4:
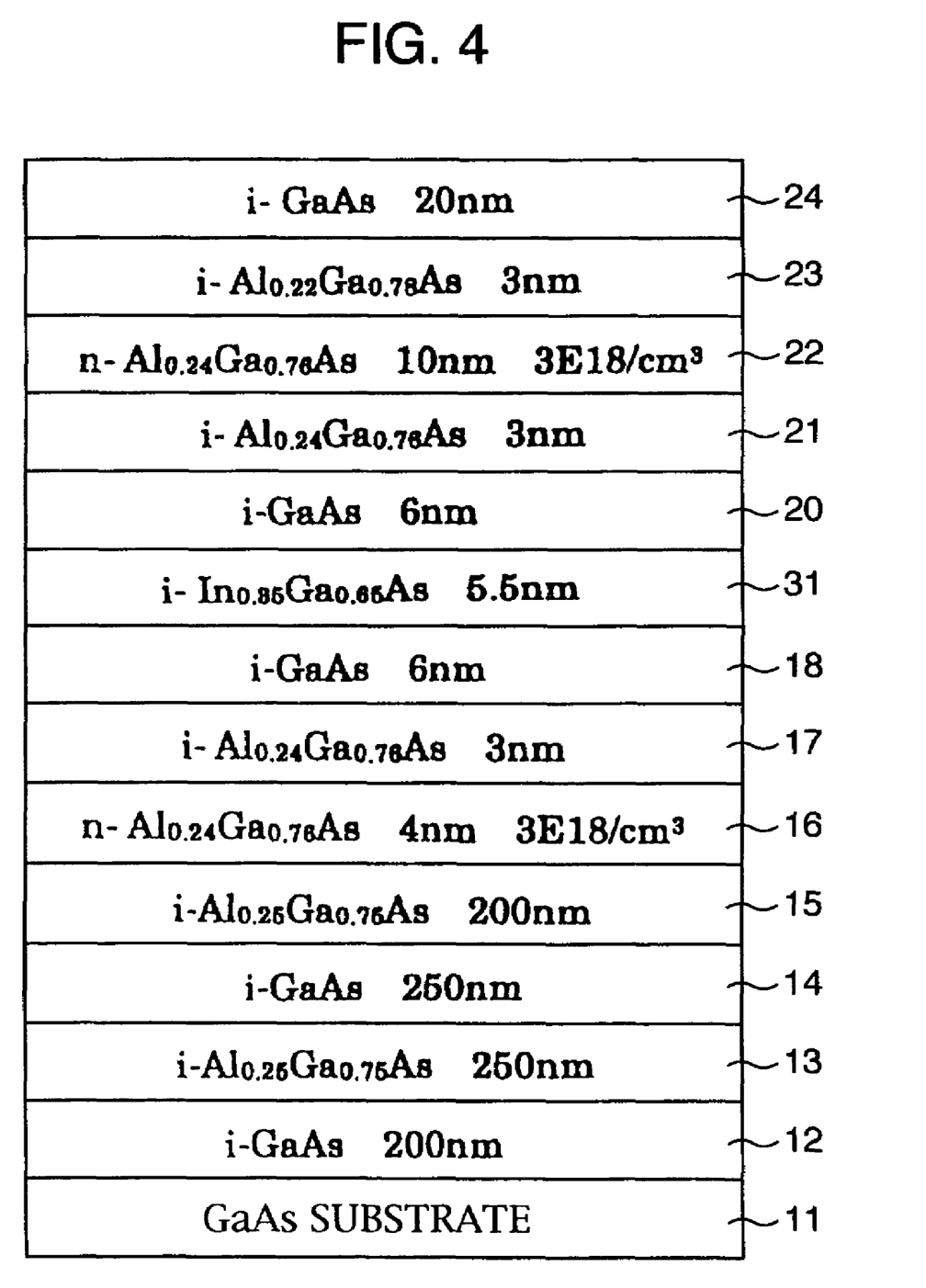
FIG. 4 is a drawing which shows a layer structure of Example 2 of an epitaxial substrate according to the present invention.

A HEMT structure epitaxial substrate having a laminated structure shown in FIG. 4 was fabricated in a MOCVD reactor by using a GaAs substrate. A layer structure shown in FIG. 4 is the same as a layer structure shown in FIG. 3 except only that the channel layer 31 has an In composition of 0.35 and a Ga composition of 0.65 as well as having a thickness of 5.5 nm. Therefore, layers in FIG. 4 corresponding to layers in FIG. 3 are respectively marked with the like reference numerals, and overlapped descriptions of these layers are omitted.

As for the laminated structure shown in FIG. 4 which was epitaxially grown under the same conditions as in the case of Example 1, the result of performing the hall measurement in accordance with a Van der Pauw method showed better measurement values, that is, the channel layer 31 had a two-dimensional electron gas concentration of $2.22 \times 10^{12}/cm^2$ at room temperature (300 K), an electron mobility of 8950 $cm^2/V \cdot s$ at room temperature (300 K), a two-dimensional electron gas concentration of $2.50 \times 10^{12}/cm^2$ at 77 K, and an electron mobility of 33000 $cm^2/V \cdot s$ at 77 K. In addition, as a result of performing a CV measurement by using an Al schottky electrode with respect to this structure, a pinch-off voltage at a residual carrier concentration of $1 \times 10^{15}/cm^3$ was −1.75 V.

In addition, a PL spectrum at 77 K was measured with respect to the laminated structure of Example 2 as shown in FIG. 4. An emission peak wavelength from the channel layer was 1075 nm.

COMPARATIVE EXAMPLE 1

Figure 5:
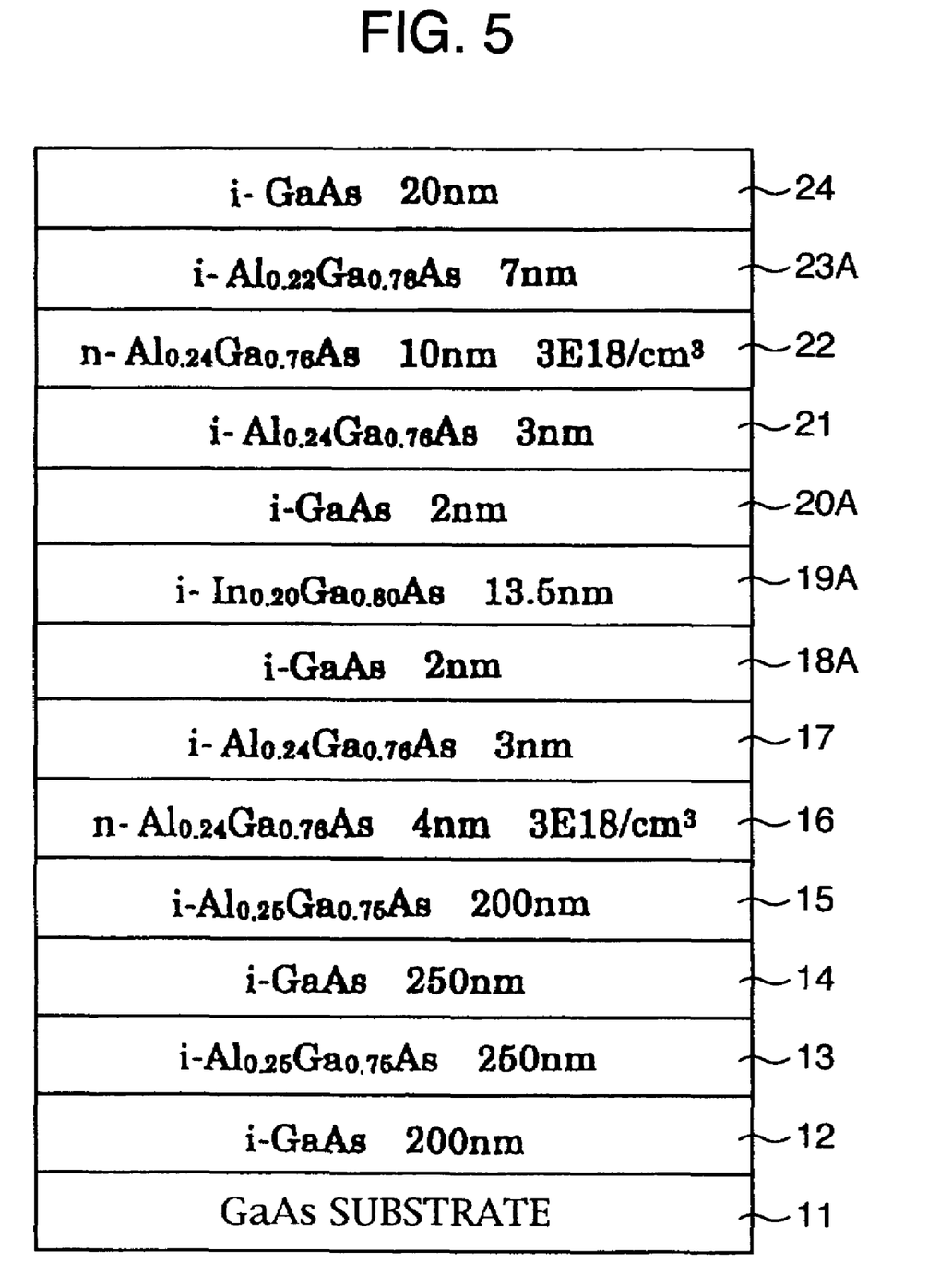
FIG. 5 is a drawing of a layer structure of Comparative Example 1.

A HEMT structure epitaxial substrate having a laminated structure shown in FIG. 5 was fabricated as Comparative Example 1 in a MOCVD reactor by using a GaAs substrate. A layer structure shown in FIG. 5 is the same as a layer structure of Example 1 shown in FIG. 3 except only that the channel layer 19A has an In composition of 0.20 and a Ga composition of 0.80 as well as having a thickness of 13.5 nm, and that each of i-GaAs layers 18A and 20A as the back side and front side spacer layers has a thickness of 2 nm and the undoped layer 23A has a thickness of 7 nm. Therefore, layers in FIG. 5 corresponding to layers in FIG. 3 are respectively marked with the like reference numerals, and overlapped descriptions of these layers are omitted.

As for the laminated structure of Comparative Example 1 shown in FIG. 5 which was epitaxially grown under the same conditions as in the case of Example 1, the result of performing the hall measurement in accordance with a Van der Pauw method was as follows, that is, the channel layer 19A had a two-dimensional electron gas concentration of $2.55 \times 10^{12}/cm^2$ at room temperature (300 K), an electron mobility of 7200 $cm^2/V \cdot s$ at room temperature (300 K), a two-dimensional electron gas concentration of $2.78 \times 10^{12}/cm^2$ at 77 K, and an electron mobility of 21900 $cm^2/V \cdot s$ at 77 K. These values were similar to the conventionally reported values. In addition, as a result of performing a CV measurement by using an Al schottky electrode with respect to this structure, a pinch-off voltage at a residual carrier concentration of $1 \times 10^{15}/cm^3$ was −2.12 V.

In addition, a PL spectrum at 77 K was measured with respect to the laminated structure of Comparative Example 1 shown in FIG. 5. An emission peak wavelength from the channel layer was 998 nm.

COMPARATIVE EXAMPLE 2

Figure 6:
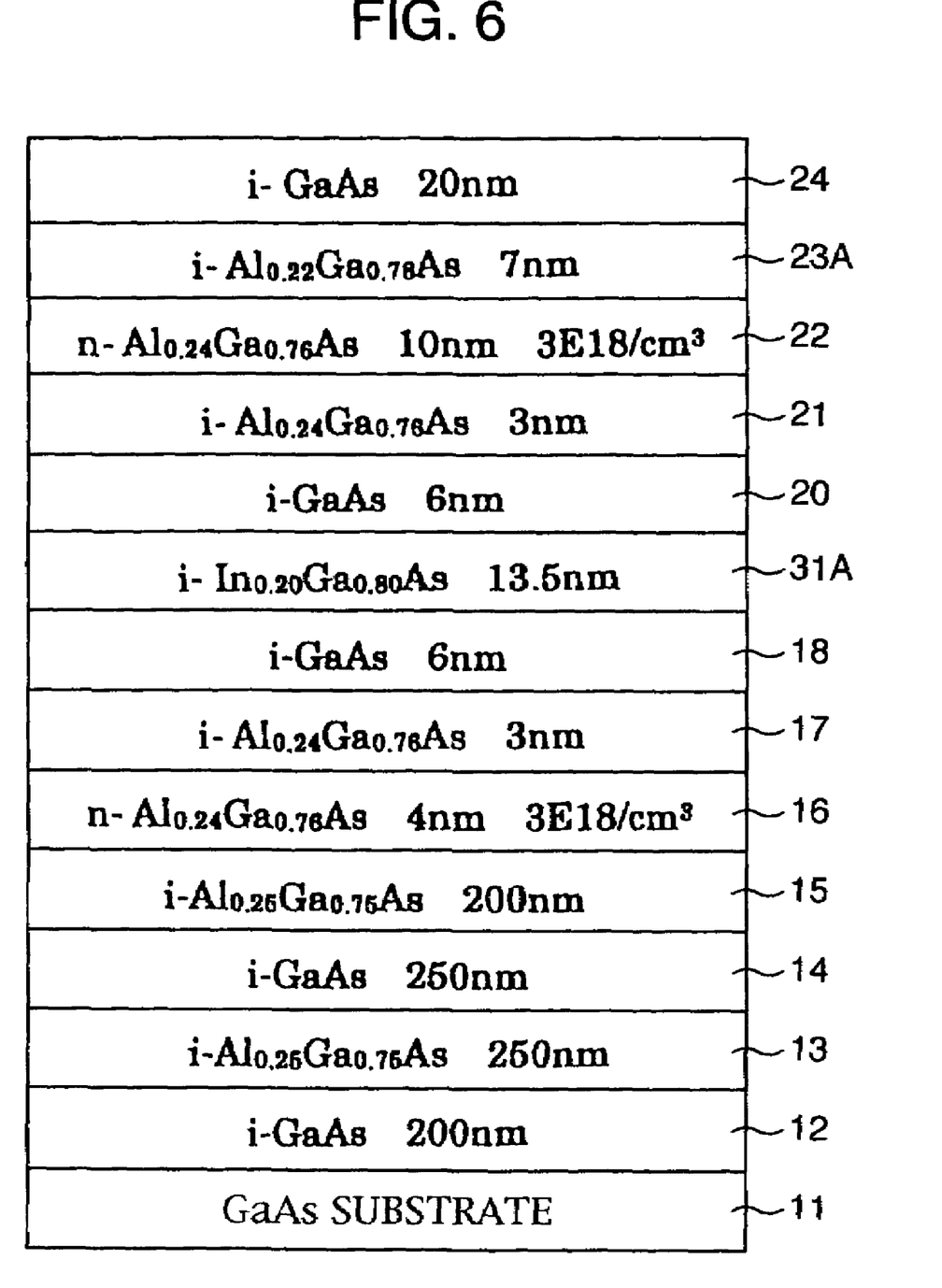
FIG. 6 is a drawing of a layer structure of Comparative Example 2.

A HEMT structure epitaxial substrate having a laminated structure shown in FIG. 6 was fabricated as Comparative Example 2 in a MOCVD reactor by using a GaAs substrate. A layer structure shown in FIG. 6 is the same as a layer structure of Example 2 shown in FIG. 4 except only that the channel layer 31A has an In composition of 0.20 and a Ga composition of 0.80 as well as having a thickness of 13.5 nm, and that the none-doped layer 23A has a thickness of 7 nm. Therefore, layers in FIG. 6 corresponding to layers in FIG. 4 are respectively marked with the like reference numerals, and overlapped descriptions of these layers are omitted.

As for the laminated structure of Comparative Example 2 shown in FIG. 6 which was epitaxially grown under the same conditions as in the case of Example 2, the result of performing the hall measurement in accordance with a Van der Pauw method was as follows, that is, the channel layer 31A had a two-dimensional electron gas concentration of $2.19 \times 10^{12}/cm^2$ at room temperature (300 K), an electron mobility of 7790 $cm^2/V \cdot s$ at room temperature (300 K), a two-dimensional electron gas concentration of $2.44 \times 10^{12}/cm^2$ at 77 K, and an electron mobility of 30800 $cm^2/V \cdot s$ at 77 K. These values were similar to the conventionally reported values. In addition, as a result of performing a CV measurement by using an Al schottky electrode with respect to this structure, a pinch-off voltage at a residual carrier concentration of $1 \times 10^{15}/cm^3$ was −1.90 V.

In addition, a PL spectrum at 77 K was measured with respect to the laminated structure of Comparative Example 2 shown in FIG. 6. An emission peak wavelength from the channel layer was 996 nm.

It has been confirmed by the results from Examples 1, 2 and Comparative Examples 1, 2 that, in the pHEMT structure epitaxial substrate, an electron mobility at room temperature (300 K) can be increased to 8300 $cm^2/V \cdot s$ or more by forming a GaAs layer on each of a top surface and a bottom surface of an InGaAs channel layer to a thickness of 4.0 nm or more, increasing an In composition of the channel layer, and adjusting a PL emission wavelength from the InGaAs channel layer to 1030 mm or more.

It is considered that an increase in thickness of the GaAs layer laminated on each of a top surface and a bottom surface of the InGaAs channel layer reduces irregularities of an interface between the InGaAs layer and the AlGaAs layer, which leads to prevention of the reduction in electron mobility due to the scattering caused by the irregularities of the interface. At the same time, it is also considered that three-dimensional growth at a surface of the InGaAs layer due to segregation of In is prevented, which has an effect of preventing the scattering at the interface as well. In addition, when a GaAs single crystal substrate which is less-dislocated with respect to a VGF substrate or a VB substrate is used, increase in a critical thickness of the InGaAs layer prevents the development of dislocation defects caused by a lattice misfit with the GaAs layer, therefore, this has an effect of increasing a layer thickness while keeping a favorable crystal characteristic of the InGaAs layer.

A peak wavelength of an emission spectrum from the channel layer (InGaAs layer) depends on an In composition of the channel layer and a thickness of the channel layer. A band gap becomes narrower with increasing the In composition, and the peak wavelength shifts toward a long wavelength side. In addition, an excitation level becomes lower with increasing the channel layer thickness, and also the peak wavelength shifts toward the long wavelength side. Therefore, the peak wavelength of the emission spectrum can be used as evaluation means for optimizing the In composition and thickness of the channel layer simultaneously.

Each of the layer structures of the epitaxial substrates from Examples 1, 2 and Comparative Examples 1, 2 is used as a test structure for evaluating the mobility following the Hall measurement and for evaluating the two-dimensional electron gas characteristics such as the threshold voltage measurement following the CV measurement.

In a layer structure of an actual epitaxial substrate used for fabricating a FET device, a thickness of a layer corresponding to the none-doped GaAs layer 14 of the epitaxial substrate from Examples 1, 2 and Comparative Example 1, 2 is increased, and in addition, contact layers are laminated for achieving ohmic contacts with a source electrode and a drain electrode. As the contact layer, it is usually used an n-GaAs layer doped with silicon at a concentration about $3 \times 10^{18}$ to $5 \times 10^{18}/cm^3$ and laminated to a thickness of about 100 nm.

However, the effect of improving the mobility according to the present invention is never compromised by a process for growing the contact layers and fabricating the FET device. The effect of improving the mobility according to the present invention is significant not only in the test structures for evaluating the characteristics of epitaxial substrates from Examples 1, 2 and Comparative Examples 1, 2, but also in a structure of an epitaxial substrate used for the FET device.

INDUSTRIAL APPLICABILITY

According to the present invention, there is provided a pHEMT structure epitaxial substrate having an electron mobility and a two-dimensional electron gas concentration which have never been reported before and being advantageous to the fabrication of electronic devices.

The invention claimed is:

1. A compound semiconductor epitaxial substrate for use in a strain channel high electron mobility field effect transistor, comprising an InGaAs layer as a strain channel layer and an AlGaAs layer containing n-type impurities as an electron supplying layer, wherein said InGaAs layer has an emission peak wavelength at 77 K of 1030 nm or more and wherein said InGaAs layer has an electron mobility at 300 K of 8300 $cm^2/V \cdot s$ or more.

2. The compound semiconductor epitaxial substrate according to claim 1, wherein GaAs layers are provided as spacer layers in contact with a top surface and a bottom surface of said InGaAs layer, respectively.

3. The compound semiconductor epitaxial substrate according to claim 2, wherein each of said GaAs layers has a thickness of 4 nm or more.

4. A method for manufacturing a compound semiconductor epitaxial substrate that comprises an InGaAs layer as a strain channel layer and an AlGaAs layer containing n-type impurities as an electron supplying layer, wherein said InGaAs layer has an emission peak wavelength at 77 K of 1030 nm or more, and wherein said InGaAs layer has an electron mobility at 300 K of 8300 $cm^2/V^*s$ or more, said method comprising epitaxially growing each compound semiconductor layer by employing a metalorganic chemical vapor deposition (MOCVD) method.

5. The method according to claim 4, wherein GaAs layers are provided as spacer layers in contact with a top surface and a bottom surface of said InGaAs layer, respectively.

6. The method according to claim 5, wherein each of said GaAs layers has a thickness of 4 nm or more.

* * * * *